US006983819B2

(12) United States Patent
Busque et al.

(10) Patent No.: US 6,983,819 B2
(45) Date of Patent: Jan. 10, 2006

(54) ENTERTAINMENT SOUND PANELS

(75) Inventors: Christian Busque, Lititz, PA (US); Simon Weston, Glendene Auckland (NZ); Sammy T. Que, Rizal (PH)

(73) Assignee: AWI Licensing Company, Wilmington, DE (US)

( * ) Notice: Subject to any disclaimer, the term of this patent is extended or adjusted under 35 U.S.C. 154(b) by 139 days.

(21) Appl. No.: 10/065,687

(22) Filed: Nov. 8, 2002

(65) Prior Publication Data

US 2003/0183443 A1 Oct. 2, 2003

Related U.S. Application Data

(60) Provisional application No. 60/369,007, filed on Apr. 2, 2002.

(51) Int. Cl.
*H05K 1/00* (2006.01)

(52) U.S. Cl. .......................................................... 181/150

(58) Field of Classification Search ................ 181/150, 181/151, 152, 153, 154, 155, 156, 157, 160, 181/161, 162, 163, 164, 165, 166, 171, 172, 181/173, 174
See application file for complete search history.

(56) References Cited

U.S. PATENT DOCUMENTS

| | | | | |
|---|---|---|---|---|
| 3,636,281 | A | 1/1972 | Cozart | 179/181 |
| 3,767,005 | A | 10/1973 | Bertagni | 181/32 |
| 3,961,378 | A | 6/1976 | White | 29/594 |
| 4,252,211 | A | 2/1981 | Matsuda et al. | 181/166 |
| 4,928,312 | A | 5/1990 | Hill | 381/192 |
| 4,939,784 | A | 7/1990 | Bruney | 381/202 |
| 5,007,707 | A | 4/1991 | Bertagni | 350/118 |
| 5,082,083 | A | 1/1992 | Draffen | 181/150 |
| 5,283,836 | A | 2/1994 | Trufitt | 381/199 |
| 5,693,917 | A | 12/1997 | Bertagni et al. | 181/173 |

(Continued)

FOREIGN PATENT DOCUMENTS

| | | |
|---|---|---|
| WO | WO 98/31188 | 7/1998 |

(Continued)

OTHER PUBLICATIONS

"BW2000 Flat Panel," www.ladydragon.com, Aug. 14, 1999.

(Continued)

*Primary Examiner*—Kimberly Lockett

(57) ABSTRACT

An entertainment sound panel that serves foreground music and paging applications. The entertainment sound panel of the present invention is constructed of honeycomb materials and adhesives. The driver of the entertainment sound panel is mounted and supported on a bridge structure that spans the entertainment sound panel on its back side. The driver interacts with the panel through the voice coil assembly. The driver is separated from the entertainment sound panel by a contact pad to deal with the shear problems between the sound panel and driver. Improvement in low frequency (bass) response is provided by a butt joint that lays next to an adjacent isolation pad, and can float freely. In another embodiment, the present invention provides a lower cost flat panel sound radiator for low end business applications where the performance characteristics of the radiator are less important than the cost. The low end flat panel radiator is constructed from a polypropylene or similar material. As with the entertainment sound panel, the driver of the polypropylene sound panel is mounted and supported on a bridge structure that spans the sound panel on its back side. Foam stabilizers positioned on either side of the driver are used to set the height between the polypropylene sound panel and the bridge structure.

46 Claims, 6 Drawing Sheets

U.S. PATENT DOCUMENTS

| | | | | |
|---|---|---|---|---|
| 5,701,359 | A | 12/1997 | Guenther et al. | 381/203 |
| 5,802,191 | A | 9/1998 | Guenther | 381/188 |
| 5,828,766 | A | 10/1998 | Gallo | 381/190 |
| 6,044,159 | A | 3/2000 | Schmertmann et al. | 381/186 |
| 6,097,829 | A | 8/2000 | Guenther et al. | 381/425 |
| 6,164,408 | A | 12/2000 | Lamm et al. | 181/30 |
| 6,171,534 | B1 | 1/2001 | Leach et al. | 264/102 |
| 6,176,345 | B1 | 1/2001 | Perkins et al. | 181/173 |
| 6,181,797 | B1 | 1/2001 | Parrella et al. | 381/86 |
| 6,247,551 | B1 | 6/2001 | Heron | 181/173 |
| 6,304,435 | B1 | 10/2001 | Hsu | 361/683 |
| 6,304,661 | B1 | 10/2001 | Azima et al. | 381/152 |
| 6,324,052 | B1 | 11/2001 | Azima et al. | 361/683 |
| 6,324,294 | B1 | 11/2001 | Azima et al. | 381/381 |
| 6,327,369 | B1 | 12/2001 | Azima et al. | 381/152 |
| 6,332,029 | B1 | 12/2001 | Azima et al. | 381/152 |
| 6,333,575 | B1 | 12/2001 | Bank et al. | 310/81 |
| 6,347,149 | B1 | 2/2002 | Bahmann et al. | 381/396 |
| 6,377,695 | B1 | 4/2002 | Azima et al. | 381/152 |
| 6,427,016 | B1 | 7/2002 | Azima et al. | 381/152 |
| 6,442,282 | B2 | 8/2002 | Azima et al. | 381/152 |
| 6,481,173 | B1 * | 11/2002 | Roy et al. | 52/506.07 |
| 6,779,627 | B2 * | 8/2004 | Beakes et al. | |
| 2001/0017924 | A1 | 8/2001 | Azima et al. | 381/165 |
| 2001/0017927 | A1 | 8/2001 | Bachmann et al. | 381/395 |
| 2001/0038701 | A1 | 11/2001 | Corynen | 381/152 |
| 2001/0048751 | A1 | 12/2001 | Ellis | 381/431 |
| 2001/0055403 | A1 | 12/2001 | Bachmann et al. | 381/190 |
| 2002/0015507 | A1 | 2/2002 | Harris et al. | 381/431 |
| 2002/0021812 | A1 | 2/2002 | Bank | 381/152 |
| 2002/0027999 | A1 | 3/2002 | Azima et al. | 381/431 |
| 2002/0039430 | A1 | 4/2002 | Nakaso | 381/396 |
| 2002/0125065 | A1 | 9/2002 | Bank | 181/161 |

FOREIGN PATENT DOCUMENTS

| | | |
|---|---|---|
| WO | WO 98/52381 | 11/1998 |
| WO | WO 98/52383 | 11/1998 |
| WO | WO 99/02012 | 1/1999 |
| WO | WO 99/08479 | 2/1999 |
| WO | WO 99/21397 | 4/1999 |
| WO | WO 99/37121 | 7/1999 |
| WO | WO 99/52324 | 10/1999 |

OTHER PUBLICATIONS

"Hang 'em High," www.PopularMechanics.com, Sep. 1998.

Chiu, Jason, "Benwin Flat Panel Speaker," www.hardwarecentral.com, Apr. 19, 2002.

* cited by examiner

ENTERTAINMENT SOUND PANELS

CROSS REFERENCE TO RELATED APPLICATIONS

The present patent application is a formalization of a previously filed, co-pending provisional patent application entitled "Entertainment Sound Panels", filed Apr. 2, 2002, as U.S. patent application Ser. No. 60/369,007 by the inventors named in this patent application. This patent application claims the benefit of the filing date of the cited provisional patent application according to the statutes and rules governing provisional patent applications, particularly USC § 119(e)(1) and 37 CFR § § 1.789(a) (4) and (a)(5). The specification and drawings of the provisional patent application are specifically incorporated herein by reference.

BACKGROUND OF THE INVENTION

The present invention relates generally to sound processing systems. More particularly, the present invention relates to flat panel sound radiators for use in sound processing systems wherein either high performance or low cost is a threshold determinant.

Flat panel radiators work on the principle that an exciter hooked up the flat panels causes the panels to vibrate, generating sound. The sound that is generated by flat panel radiators is not restricted to the cone of sound that normal speakers generate. The vibration of the panel generates a complex random ripple of wave forms on the panel surface, which in an ideal model, radiate sound in a circular pattern from the panel. The omni-directional radiation pattern of the flat panel radiators means that the sound levels are equal across a large listening area.

The flat panel radiator includes a light, stiff radiating panel of arbitrary size and a transducer. The transducer (exciter) has a magnet clamped to the radiating panel, a voice coil assembly, also attached to the panel, and wiring connecting to an excitation source. When electrical current is passed through the voice coil, the resulting combination of electromagnetic field forces with the magnetic field will induce a very small relative displacement, or bending of the panel material at the mounting points. The broad radiation pattern and lack of beaming behavior characteristic of this technology can best be achieved through a flat panel made of honeycomb cell-type material. The honeycomb material provides minimal loss and a smooth sound pressure response in the low, middle, and high frequency ranges. The honeycomb core material is typically sandwiched between skins of high strength composite material. A bonding adhesive is used to attach the skin material to the honeycomb core. The resultant honeycomb panel offers one of the highest strength-to-weight constructions available.

There are several problems with the flat panel sound radiators of the prior art. One such problem is that flat panel sound radiators have inherently low signal-to-noise ratios such that the quality of the sound produced has been relatively low. This is not a concern when flat panel sound radiators are used in low end applications; however, it has made this technology unsatisfactory for high end speaker systems wherein a much higher signal-to-noise ratio is required. Furthermore, the flat diaphragms of prior art flat panel sound radiators generally have not been able to exhibit large excursions, resulting in poor bass response and relatively low volume limits.

Another problem with prior art flat panel sound radiators is that they have not been upwardly scalable to larger sizes for applications in theaters, or as commercial speaker systems. In order to scale up a prior art flat panel sound radiator to reproduce high volumes and/or good bass, a larger exciter with a heavy magnet structure is required to impart the necessary excursions to the panel. The prior art approach of mounting exciters directly to the flat panel sound radiators is not feasible when scaling up to larger, heavier exciters for several reasons. The heavier exciter mounted to the flat panel sound radiator acts as an acoustic damper that impedes the reproduction of sound by the panel. Furthermore, the greater weight of the exciter causes the panel to droop when mounted horizontally and torques the panel when it is mounted vertically. A heavy exciter mounted directly to the panel could damage the flat panel radiator or sheer off completely during shipment.

A further problem encountered in scaling up prior art flat panel sound radiators results from the increased size and mass of the voice coil and a larger exciter. As the voice coil is made larger by increasing the number of windings and/or the gauge of the wire in the windings, the impedance of the coil increases, particularly at higher frequencies. This reduces the efficiency of the exciter at higher frequencies, resulting in a high frequency response roll-off. Therefore, as the exciter structure is scaled up to produce greater excursions in the panel required for higher volumes and better base response, the high frequency response of the radiator tends to degrade proportionally. The use of scrim as a decorative cover has also been shown to deteriorate high frequency response.

For the above reasons, there have been no flat panel sound radiators that provide a flat frequency response over the range of frequencies generally required for entertainment speakers. The entertainment sound panel of the present invention is directed to satisfy that need.

Another problem that exists in prior art that has prevented the widespread use of flat panel sound radiators in smaller, closed environments where a flat frequency response over the entertainment bandwidth is not required, has been the cost of such flat panel radiators. Therefore, a secondary need exists for a flat panel sound radiator that can be used in small business or office settings and that is inexpensive.

SUMMARY OF THE INVENTION

The present invention provides a high end sound panel (also referred to herein as an entertainment sound panel) that serves foreground music and paging applications. In another embodiment, the present invention provides a lower cost flat panel sound radiator for low end business applications where the performance characteristics of the radiator are less important than the cost.

The entertainment sound panel of the present invention is constructed of carefully selected materials and adhesives, as discussed below. The entertainment sound panel exhibits good sound quality and a high signal-to-noise ratio over the audible spectrum. The exciter of the entertainment sound panel is mounted and supported on a bridge structure that spans the entertainment sound panel on its back side. The weight of the exciter is supported by the bridge and not by the panel itself. The exciter interacts with the panel through the voice coil assembly. The exciter (also referred to herein as driver or transducer) is separated from the entertainment sound panel by a contact pad to deal with the shear problems between the sound panel and exciter. Improvement in low frequency (bass) response is provided by a butt joint that lies next to an adjacent isolation pad, and can float freely. A secondary driver, commonly referred to as a tweeter, has been imbedded into the panel board to provide high frequency response.

In another embodiment intended for low end applications where cost is the primary determinant for usage, the flat panel radiator is constructed from a polypropylene or similar material, which has a significant impact on cost. As with the entertainment sound panel, the exciter of the polypropylene sound panel is mounted and supported on a bridge structure that spans the sound panel on its back side. The exciter is again separated from the sound panel by a contact pad to deal with the shear problems between the sound panel and exciter.

BRIEF DESCRIPTION OF DRAWINGS

The invention is better understood by reading the following detailed description of the invention in conjunction with the accompanying drawings, wherein.

DETAILED DESCRIPTION

The assignee of the present invention has related patent applications pending that disclose the use of flat panel radiator technology for generating acoustic signals for masking of noise in an industrial environment. Patent application Ser. Nos. 09/627,706 and 09/641,071 disclose various assemblies for mounting flat panel radiators including installation in a standard inverted "T" ceiling grid. The radiator panel includes an attached bridge support element and an enclosure containing electrical components for connecting a transducer to an external-driving source. Patent application Ser. Nos. 10/003,928 and 10/003,929 disclose the use of flat panel radiators having honeycomb cores sandwiched between facing skins and having defined technical characteristics. The complete disclosure of each of these four pending applications is hereby incorporated by reference. Although these pending patent applications describe mounting of flat panel radiators in a ceiling grid, the flat panel radiators described can also be mounted in wall partitions, with the front of the radiator facing into the enclosed room.

The entertainment sound panel of the present invention is constructed with a honeycomb core sandwiched between front and back facing skins that are secured to the core with adhesive. The materials from which the core, skins, and adhesive are made are carefully selected to optimize the stiffness, strength, structural flexibility and acoustic characteristics to meet the criteria of low self-noise, good bass frequency response, high sound pressure level capability, good acoustical damping, and a high signal-to-noise ratio comparable to that of conventional flat and conical diaphragm loudspeaker systems.

In one exemplary embodiment, the honeycomb core of the panel is fabricated from Kraft paper rather than aluminum as in some prior art panels. The Kraft paper core is phenolic impregnated for stiffness and dimensional stability, particularly in regards to increased resistance to moisture absorption. The Kraft paper provides both high flexibility and exhibits exceptionally low self-noise.

The front and back facing skins of the entertainment panel in an exemplary embodiment are fabricated from an aramid polyamide such as Kevlar or Nomex, both available from E.I. du Pont de Nemours and Co., Inc. These materials exhibit a high Young's modulus for rapid dispersion of sound waves through the panel, excellent energy dissipation characteristics for damping of large vibrational excursions, and very low self-noise. In addition, these materials exhibit superb tensile strength to withstand bending and flexing during sound reproduction, particularly at higher volumes, without cracking, notching, or creasing. The aramid polyamide skins are secured to the core with a flexible adhesive with good damping characteristics such as, for example, water based acrylic, rubber cement, or a silicone adhesive.

Figure 1:
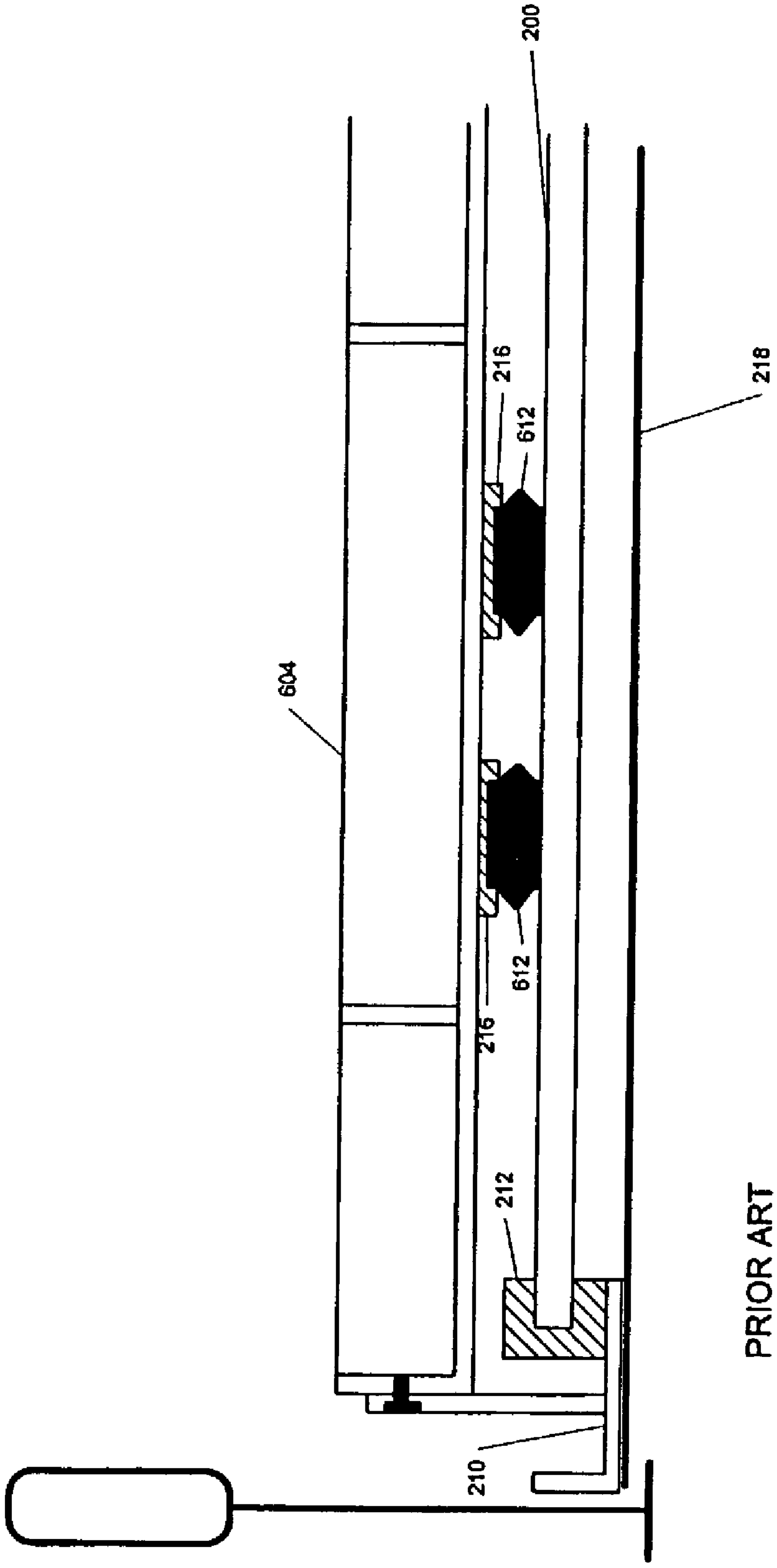
FIG. 1 PRIOR ART
FIG. 1 illustrates a prior art flat panel sound radiator for use in a ceiling grid in which a pair of exciters are mounted to the panel and separated from a bridge assembly by isolation pads.

FIG. 1 depicts a prior art flat panel sound radiator 200 supported in a frame 210 by an isolation element 212. The isolation element 212 isolates the flat panel radiator from the ceiling grid system. A pair of electromechanical drivers or exciters 612 are mounted to the back side of the panel 200 and are electrically coupled by wires to an audio power amplifier (not shown) for driving the exciters 612 with alternating current corresponding to an audio program to be reproduced by the flat panel sound radiator 200. The drivers 612 may take on any of a variety of configurations for imparting vibrational bending to the flat panel sound radiator 200. Drivers 612 are available from New Transducers Limited (NXT) and other companies. The drivers 612 shown in FIG. 1 are attached directly to, and supported by the flat panel 200. Isolation elements 216 are positioned on the top of drivers 612 and are fastened by adhesives to bridge assembly 604. Also shown in FIG. 1 is scrim 218, which is a decorative cover for the flat panel radiator that can be fabricated to aesthetically match the rest of the ceiling.

Figure 2:
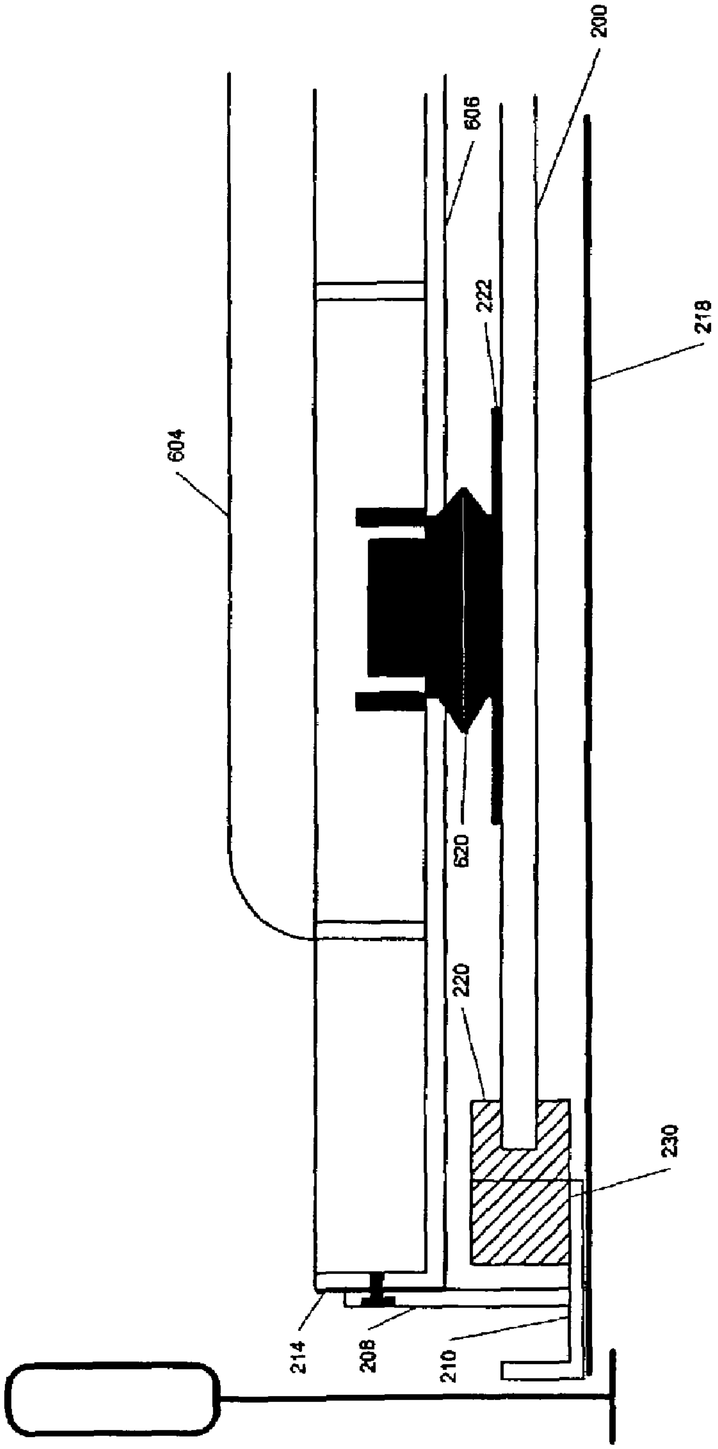
FIG. 2 illustrates an entertainment sound panel for use in a ceiling grid in which the panel is positioned in a friction-held panel assembly wherein the panel can slide along an adjacent isolation pad in accordance with an exemplary embodiment of the invention.

In the embodiment of the flat panel sound radiator 200 illustrated in FIG. 1, low frequency excursions of the flat panel sound radiator are restricted by the adhesion of the semi-compliant isolation element to the frame 210. FIG. 2 addresses the problems encountered by the flat panel sound radiator 200 of FIG. 1 by mounting the driver 620 to the bridge assembly 604 and by inserting a contact pad 222 that is adhesively fastened to both the flat panel 200 and the bottom ring element of driver 620. The contact pad 222 increases the surface area for the bond to the flat panel 200. Isolation element 230 isolates the flat panel radiator 200 from frame element 210. A second isolation element 220 is added and adheres to the first isolation element 230 to enable excursions of the flat panel vertically, thereby improving the low frequency response and converting the flat panel into an entertainment sound panel. The flat panel radiator (i.e., entertainment sound panel) is positioned in the second isolation element 220 and is held in place by friction between the radiator and second isolation element. The flat panel radiator is the same honeycombed structure with Nomex skins as represented by the flat panel radiator of FIG. 1. The scrim 218 is also the same as that depicted in FIG. 1. One driver 620 is used in the embodiment depicted. A suitable driver for use with the entertainment sound panel is available from Dai-Ichi Electronics. As shown in FIG. 2, the magnet of the driver 620 is mounted within bridge assembly 604. The base 606 of the metal frame of bridge assembly 604 was increased in thickness to strengthen the metal frame and reduce the shear between bridge assembly 604 and driver 620. The contact pad 222 is made of sufficient dimensions to fully cover the bottom ring of driver 620 to increase bond surface area to flat panel 200.

An additional isolation element 214 is added between bridge assembly 604 and frame 210 on the upper side flange 208. The "spider" throat around the magnet has also been stiffened in this embodiment. The spider controls the position of the voice coil.

Figure 3:
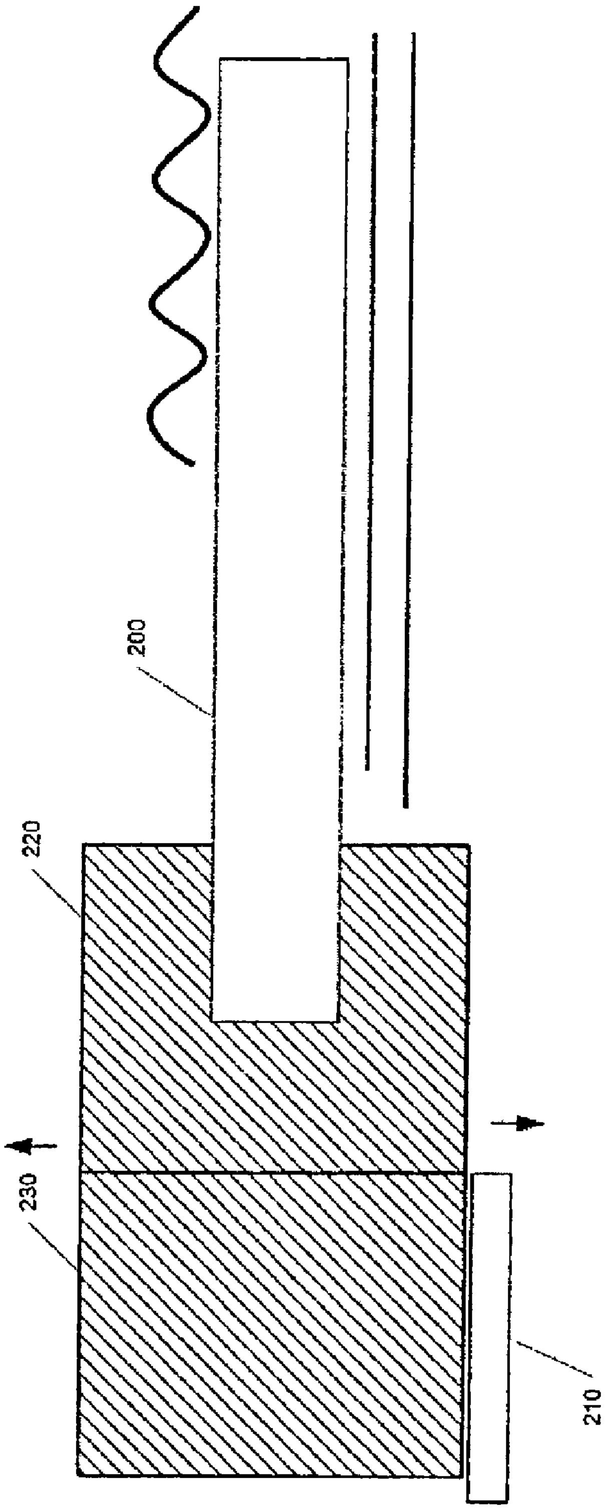
FIG. 3 illustrates details of the friction-held panel assembly for the entertainment sound panel in accordance with an exemplary embodiment of the present invention.

The isolation element 220 is referred to herein as a butt joint and is depicted in greater detail in FIG. 3. Since the metal frame 210 does not extend beyond the isolation element 230, the flat panel can move more easily in a vertical direction. The flat panel 200 can slide along the isolation element 220 at low frequencies and can vibrate at high frequencies to provide an entertainment quality sound radiator.

Although the embodiment depicted in FIGS. 2 3 represent an entertainment sound panel mounted in a frame of a ceiling grid system, the entertainment sound panel could easily be mounted in a wall or wall partition. The entertainment sound panel could also be mounted in a stand alone assembly such as a desktop or bookshelf radiator panel.

Figure 4:
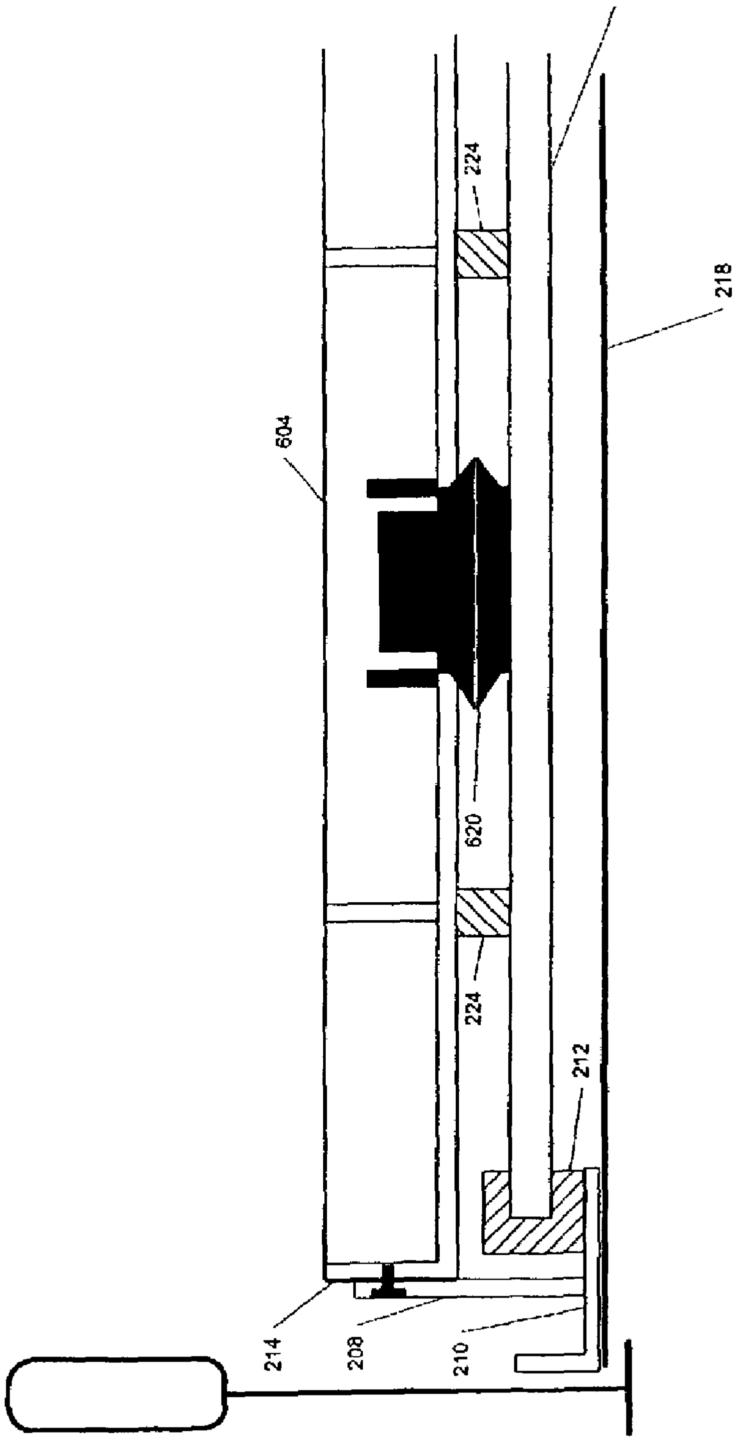
FIG. 4 illustrates an implementation of a low cost panel assembly for use in a ceiling grid in accordance with an exemplary embodiment of the present invention.

A low cost flat panel radiator assembly is shown in FIG. 4. The material for the low cost flat panel can be polypropylene. A flat panel 300 of this material reduces the cost of the flat panel itself by a factor of approximately 10 over the cost of a flat panel honeycomb structure. A single driver 620 is used and the driver is mounted to the bridge assembly 604. One foam stabilizer 224 is used on each side of the driver 620 to set the height between the polypropylene panel board 300 and the bridge assembly 604. Since sound quality is not a primary concern, a single isolation element 212 is used to support the flat panel 300 in the frame 210.

Figure 5:
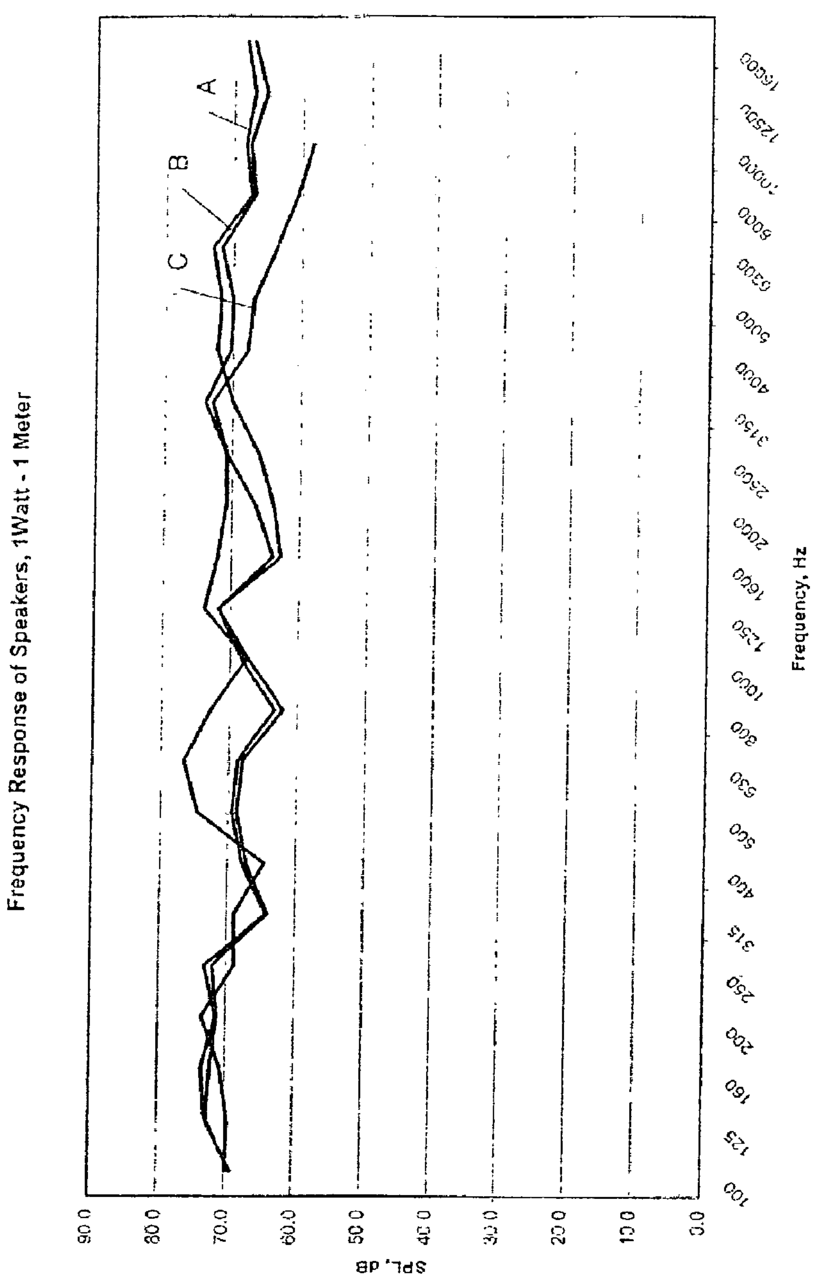
FIG. 5 illustrates the frequency response for a plurality of entertainment sound panels and a control panel in accordance with an exemplary embodiment of the present invention.

The measured frequency response for a plurality of entertainment sound panels is shown in FIG. 5. The sound pressure level (SPL) is determined by transmitting one watt across the entertainment range bandwidth and measuring the sound pressure one meter away from the sound panel. The sensitivity of the entertainment sound panels is approximately 84 dB over the bandwidth from 50 Hz to 16 KHz. The two entertainment panels (graphs A, B), as represented by the embodiment shown in FIG. 2, exhibit a relatively flat frequency response over the range from 50 Hz to 16 KHz. The control panel (graph C) represents the measured sound pressure level for a flat panel radiator such as that illustrated in FIG. 1, which shows greater variability at low frequencies and a more rapid roll-off above 5 KHz.

Figure 6:
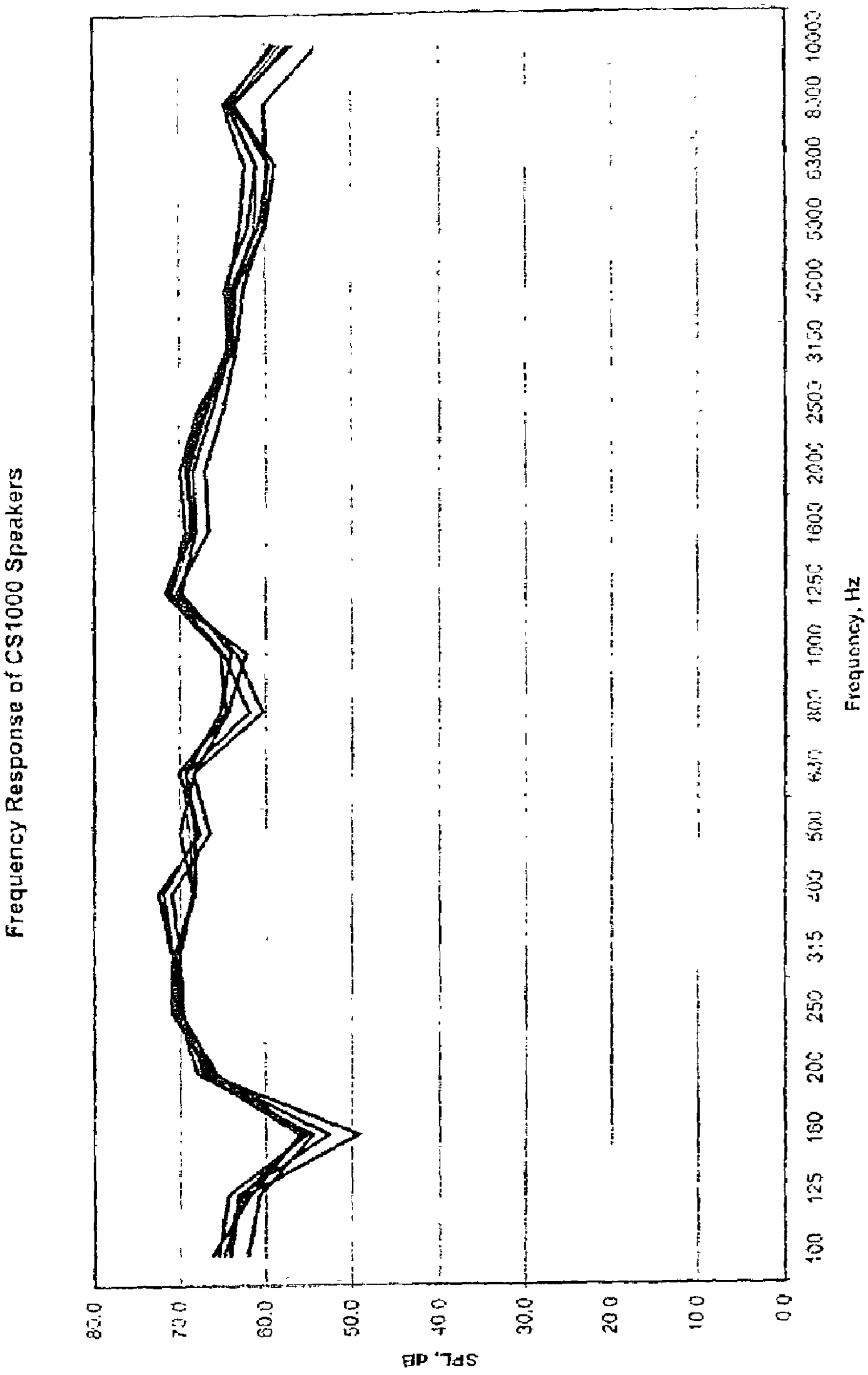
FIG. 6 illustrates the frequency response for a plurality of low cost sound panels in accordance with an exemplary embodiment of the present invention.

FIG. 6 illustrates the frequency response for a plurality of low cost sound panels using a polypropylene material for the low cost panel. The sensitivity of the low cost polypropylene sound panels is greater than 80 dB over the bandwidth from 200 Hz to 5 KHz (i.e., the speech range). The SPL is determined over the frequency range from 100 Hz to 10 KHz. The frequency response is very similar for each of the sound panels tested. There is a noticeable performance degradation below 250 Hz, but overall, the low cost sound panels exhibit a fairly good frequency response over the frequency range depicted making them a very suitable low cost alternative for installations in which paging and background music are the primary needs.

The entertainment sound panel and polypropylene sound panel have been described as high quality and low cost structures, respectively, that can be used depending on the sound environment requirements for any defined space, whether or not the space is enclosed. Specifically, the entertainment sound panel provides a flat frequency response from approximately 50 Hz to 16 KHz. The entertainment panel can be mounted in a ceiling grid, a wall partition or can be provided as a stand-alone panel for use with entertainment systems, desktop computers, or workstations. The entertainment panel can also be incorporated into electronic devices such as laptop computers. The low cost polypropylene panels can be used in spaces where an inexpensive paging capability is needed.

The corresponding structures, materials, acts, and equivalents of all means plus function elements in any claims below are intended to include any structure, material or acts for performing the functions in combination with other claim elements as specifically claimed.

Those skilled in the art will appreciate that many modifications to the exemplary embodiment of the present invention are possible without departing from the spirit and scope of the present invention. In addition, it is possible to use some of the features of the present invention without the corresponding use of the other features. Accordingly, the foregoing description of the exemplary embodiment is provided for the purpose of illustrating the principles of the present invention and not in imitation thereof since the scope of the present invention is defined solely by the appended claims.

What is claimed is:

1. A flat panel radiator assembly comprising: a frame including a horizontal portion and a vertical portion; a flat panel radiator disposed within the frame and having a front surface and a back surface; an acoustic transducer for inducing motion in the flat panel radiator to reproduce an audio signal; a support structure attached to the vertical portion of the frame and providing a mounting surface for the acoustic transducer; a first isolation element interposed between the flat panel radiator and the horizontal portion of the frame to isolate the flat panel radiator from the frame; and a second isolation element adjacent to the first isolation element for enabling the flat panel radiator to vibrate and move vertically in response to motion induced by the acoustic transducer.

2. The flat panel radiator assembly of claim 1 wherein the support structure spans the flat panel radiator on the back surface of the radiator.

3. The flat panel radiator assembly of claim 1 wherein the support structure supports the entire weight of the acoustic transducer.

4. The flat panel radiator assembly of claim 1 further comprising a contact pad inserted between the back surface of the flat panel radiator and the transducer.

5. The flat panel radiator assembly of claim 4 wherein the contact pad is adhesively fastened to both the flat panel radiator and the transducer.

6. The flat panel radiator assembly of claim 5 wherein the contact pad fully covers a bottom ring of the transducer.

7. The flat panel radiator assembly of claim 1 further comprising a third isolation element interposed between the support structure and the vertical portion of the frame.

8. The flat panel radiator assembly of claim 1 wherein the second isolation element adheres to the adjacent first isolation element.

9. The flat panel radiator assembly of claim 1 wherein the flat panel radiator is positioned in the second isolation element and held in place by friction between the radiator and the second isolation element.

10. The flat panel radiator assembly of claim 9 wherein the flat panel radiator slides vertically inside the second isolation element in response to a low frequency audio signal.

11. The flat panel radiator assembly of claim 9 wherein the flat panel radiator vibrates inside the second isolation element in response to a high frequency audio signal.

12. The flat panel radiator assembly of claim 1 further comprising a scrim attached to the horizontal portion of the frame to provide a decorative cover for the flat panel radiator.

13. The flat panel radiator assembly of claim 1 wherein the flat panel radiator provides a flat frequency response over an audible range of frequencies from approximately 50 Hz to 16 KHz.

14. The flat panel radiator assembly of claim 13 wherein the flat panel radiator has a sensitivity of approximately 84 dB.

15. The flat panel radiator assembly of claim 1 further comprising a voice coil and a magnet mounted within the support structure.

16. The flat panel radiator assembly of claim 1 wherein the flat panel radiator comprises a core that is covered by facings on each of the front and back surfaces.

17. The flat panel radiator assembly of claim 16 wherein the core is fabricated from Kraft paper.

18. The flat panel radiator assembly of claim 16 wherein the facings are fabricated from an aramid polyamide material.

19. A flat panel radiator assembly comprising: a frame including a horizontal portion and a vertical portion; a flat panel radiator disposed within the frame and having a front surface and a back surface; an acoustic transducer for inducing vibrational motion in the flat panel radiator to reproduce an audio signal; a support structure attached to the vertical portion of the frame and providing a mounting surface for the acoustic transducer; an isolation element interposed between the flat panel radiator and the horizontal portion of the frame to isolate the flat panel radiator from the frame; and a plurality of stabilizers disposed between the flat panel radiator and the support structure.

20. The flat panel radiator of claim 19 wherein the support structure spans the flat panel radiator on the back surface of the radiator.

21. The flat panel radiator assembly of claim 19 wherein the support structure supports the entire weight of the acoustic transducer.

22. The flat panel radiator assembly of claim 19 further comprising an additional isolation element interposed between the support structure and the vertical portion of the frame.

23. The flat panel radiator assembly of claim 19 wherein the flat panel radiator assembly is installed in a suspended ceiling grid system.

24. The flat panel radiator assembly of claim 19 wherein the flat panel radiator assembly is installed in a wall partition with the front panel of the radiator facing into an enclosed space.

25. The flat panel radiator assembly of claim 19 wherein the flat panel radiator assembly is a standalone apparatus.

26. The flat panel radiator assembly of claim 19 wherein the flat panel radiator vibrates inside the isolation element in response to an audio signal.

27. The flat panel radiator assembly of claim 19 further comprising a scrim attached to the horizontal portion of the frame to provide a decorative cover for the flat panel radiator.

28. The flat panel radiator assembly of claim 19 wherein the flat panel radiator provides a frequency response over an audible range of frequencies from approximately 200 Hz to 5 KHz.

29. The flat panel radiator assembly of claim 28 wherein the flat panel radiator has a sensitivity of approximately 80 dB.

30. The flat panel radiator assembly of claim 19 further comprising a voice coil and a magnet mounted within the support structure.

31. The flat panel radiator assembly of claim 19 wherein the flat panel radiator comprises a polypropylene material.

32. A flat panel radiator assembly comprising: a frame; a flat panel radiator disposed within the frame; an electromechanical transducer for inducing motion in the flat panel radiator to reproduce an audio signal supplied to the transducer; a bridge attached to the frame and providing a mounting surface for the electromechanical transducer; and an isolation element for supporting and isolating the flat panel radiator from the frame thereby enabling the flat panel radiator to vibrate and to slide vertically in response to motion induced by the audio signal supplied to the electromechanical transducer.

33. The flat panel radiator assembly of claim 32 wherein the flat panel radiator assembly is installed in a suspended ceiling grid system.

34. The flat panel radiator assembly of claim 32 wherein the flat panel radiator assembly is installed in a wall partition with the front panel of the radiator facing into an enclosed space.

35. The flat panel radiator assembly of claim 32 wherein the flat panel radiator assembly is a standalone apparatus.

36. The flat panel radiator of claim 32 wherein the bridge spans a length of the flat panel radiator on a back surface of the radiator and provides the sole support for the transducer.

37. The flat panel radiator of claim 32 further comprising a contact pad inserted between, and adhesively fastened to, the flat panel radiator and transducer.

38. The flat panel radiator of claim 32 further comprising an additional isolation element that is positioned between the bridge and the frame.

39. The flat panel radiator of claim 32 wherein the flat panel radiator slides vertically within the isolation element in response to a low frequency audio signal supplied to the transducer.

40. The flat panel radiator of claim 32 wherein the flat panel radiator vibrates in response to mid-range and high frequency audio signals supplied to the transducer.

41. The flat panel radiator of claim 32 wherein the flat panel radiator provides a relatively uniform frequency response to audio signals in the range from approximately 50 Hz to approximately 16 kHz.

42. The flat panel radiator assembly of claim 41 wherein the flat panel radiator has a sensitivity of approximately 84 dB.

43. The flat panel radiator assembly of claim 32 further comprising a voice coil and a magnet mounted within the bridge.

44. The flat panel radiator assembly of claim 32 wherein the isolation element comprises two sections.

45. The flat panel radiator assembly of claim 44 wherein a first section of the isolation element isolates the flat panel radiator from the frame.

46. The flat panel radiator assembly of claim 45 wherein a second section of the isolation element is a butt joint adjacent to the first section and providing support for the flat panel radiator when vibrational and vertical movements are induced in the radiator by the transducer.

* * * * *